(12) United States Patent
Nakajima et al.

(10) Patent No.: US 11,715,189 B2
(45) Date of Patent: Aug. 1, 2023

(54) SEMICONDUCTOR IMAGE PROCESSING APPARATUS

(71) Applicant: Kioxia Corporation, Minato-ku (JP)

(72) Inventors: Atsushi Nakajima, Kawasaki (JP); Youyang Ng, Yokohama (JP); Yuko Kono, Shinagawa (JP); Takuji Ohashi, Yokohama (JP); Chihiro Ida, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 277 days.

(21) Appl. No.: 16/933,441

(22) Filed: Jul. 20, 2020

(65) Prior Publication Data
US 2021/0027457 A1 Jan. 28, 2021

(30) Foreign Application Priority Data

Jul. 25, 2019 (JP) ................................. 2019-137061

(51) Int. Cl.
G06T 7/00 (2017.01)
G06F 30/27 (2020.01)
G06F 30/3308 (2020.01)

(52) U.S. Cl.
CPC ............ *G06T 7/0004* (2013.01); *G06F 30/27* (2020.01); *G06F 30/3308* (2020.01); *G06T 2207/10061* (2013.01); *G06T 2207/30148* (2013.01)

(58) Field of Classification Search
CPC ......... G06T 7/0004; G06T 2207/10061; G06T 2207/30148; G06T 2207/20081;
(Continued)

(56) References Cited

U.S. PATENT DOCUMENTS 7,019,311 B1 * 3/2006 Horn .................. G01R 31/2881
250/214 R
7,831,528 B2 11/2010 Doddi et al.
(Continued)

FOREIGN PATENT DOCUMENTS

JP 4589315 B2 12/2010
JP 2011-159097 A 8/2011
(Continued)

OTHER PUBLICATIONS

Aitor Alvalez-Gila et al., "Adversarial Networks for Spatial Context-Aware Spectral Image Reconstruction from RGB", 2017 IEEE International Conference on Computer Vision Workshops (ICCVW), Oct. 29, 2017.

*Primary Examiner* — Sheela C Chawan
(74) *Attorney, Agent, or Firm* — Oblon, McClelland, Maier & Neustadt, L.L.P.

(57) ABSTRACT

A semiconductor image processing apparatus has an image input unit inputs a first semiconductor image, an exposure condition input unit configured to input exposure conditions, a generator performs a process of extracting a feature amount in consideration of the exposure conditions while reducing resolution of the first semiconductor image and thereafter use the extracted feature amount to increase the resolution to generate a second semiconductor image, and a discriminator configured to discriminate whether the input image is the second semiconductor image or a third semiconductor image provided in advance. The generator performs learning so that the discriminator erroneously discriminates the second semiconductor image as the third semiconductor image based on a result discriminated by the discriminator. The discriminator performs learning so as not to erroneously discriminate the second semiconductor image as the third semiconductor image, and not to erroneously
(Continued)

1 : SEMICONDUCTOR IMAGE PROCESSING APPARATUS discriminate the third semiconductor image as the second semiconductor image.

9 Claims, 12 Drawing Sheets

(58) Field of Classification Search
CPC ........... G06T 2207/20084; G06T 7/001; G06F 30/27; G06F 30/3308
USPC .................................................. 382/151, 199
See application file for complete search history.

(56) References Cited

U.S. PATENT DOCUMENTS

| | | | |
|---|---|---|---|
| 8,743,417 B2* | 6/2014 | Tanaka ............... | G06K 15/1853 358/538 |
| 2012/0105578 A1* | 5/2012 | Ohmiya ............. | H04N 5/23238 348/241 |

FOREIGN PATENT DOCUMENTS

| | | |
|---|---|---|
| JP | 2012-177632 A | 9/2012 |
| WO | WO 2017/205537 A1 | 11/2017 |

* cited by examiner

|  | FIRST SEMICONDUCTOR IMAGE | THIRD SEMICONDUCTOR IMAGE |
|---|---|---|
| 1) | CAD DRAWING | ELECTRON MICROSCOPE IMAGE |
| 2) | ELECTRON MICROSCOPE IMAGE | CAD DRAWING |
| 3) | CAD DRAWING | OPTICAL MICROSCOPE IMAGE |
| 4) | OPTICAL MICROSCOPE IMAGE | CAD DRAWING |
| 5) | CAD DRAWING | DIFFRACTED LIGHT IMAGE |
| 6) | DIFFRACTED LIGHT IMAGE | CAD DRAWING |
| 7) | OPTICAL MICROSCOPE IMAGE | ELECTRON MICROSCOPE IMAGE |
| 8) | ELECTRON MICROSCOPE IMAGE | OPTICAL MICROSCOPE IMAGE |
| 9) | DIFFRACTED LIGHT IMAGE | ELECTRON MICROSCOPE IMAGE |
| 10) | ELECTRON MICROSCOPE IMAGE | DIFFRACTED LIGHT IMAGE |
| 11) | DIFFRACTED LIGHT IMAGE | OPTICAL MICROSCOPE IMAGE |
| 12) | OPTICAL MICROSCOPE IMAGE | DIFFRACTED LIGHT IMAGE |

FIG.12

SEMICONDUCTOR IMAGE PROCESSING APPARATUS

CROSS REFERENCE TO RELATED APPLICATIONS

This application is based upon and claims the benefit of priority from the prior Japanese Patent Application No. 2019-137061, filed on Jul. 25, 2019, the entire contents of which are incorporated herein by reference.

FIELD

Embodiments described herein relate generally to a semiconductor image processing apparatus.

BACKGROUND

In a case of manufacturing a semiconductor device using an exposure apparatus based on a computer aided design (CAD) drawing representing the layout of the semiconductor device, it is necessary to verify whether the semiconductor device is manufactured in accordance with the CAD drawing. For such verification, research using Generative Adversarial Networks (GAN) is being promoted. The use of GAN makes it possible to generate a semiconductor image that estimates a captured image of a semiconductor device (hereinafter referred to as a semiconductor captured image) and possible to evaluate whether a desired semiconductor device is to be manufactured based on a CAD drawing before actually manufacturing the semiconductor device.

An exposure apparatus is used for manufacturing a semiconductor device. The exposure apparatus emits a charged particle beam such as an electron beam or an X-ray to a semiconductor process substrate, thereby implementing a drawing process. At that time, the quality of the manufactured semiconductor device varies depending on exposure conditions such as the exposure amount and the focus condition. For this reason, it would be difficult to generate a highly reliable semiconductor image with no consideration of exposure conditions even when a semiconductor image is generated from a CAD drawing using GAN.

BRIEF DESCRIPTION OF THE DRAWINGS

FIG. 12 is a diagram illustrating all combinations of the first and third semiconductor images.

DETAILED DESCRIPTION

According to one embodiment of a semiconductor image processing apparatus has an image input unit configured to input a first semiconductor image, an exposure condition input unit configured to input exposure conditions, a generator configured to perform a process of extracting a feature amount in consideration of the exposure conditions while reducing resolution of the first semiconductor image and thereafter use the extracted feature amount to increase the resolution to generate a second semiconductor image, and a discriminator configured to discriminate whether the input image is the second semiconductor image or a third semiconductor image provided in advance. The generator is configured to perform learning so that the discriminator erroneously discriminates the second semiconductor image as the third semiconductor image based on a result discriminated by the discriminator, and the discriminator is configured to perform learning so as not to erroneously discriminate the second semiconductor image as the third semiconductor image, and not to erroneously discriminate the third semiconductor image as the second semiconductor image.

Embodiments of a semiconductor image processing apparatus will be described below with reference to the drawings. In the following description, the main components of the system will be mainly described. However, the semiconductor image processing apparatus may have components and functions not illustrated or described.

First Embodiment

Figure 1:
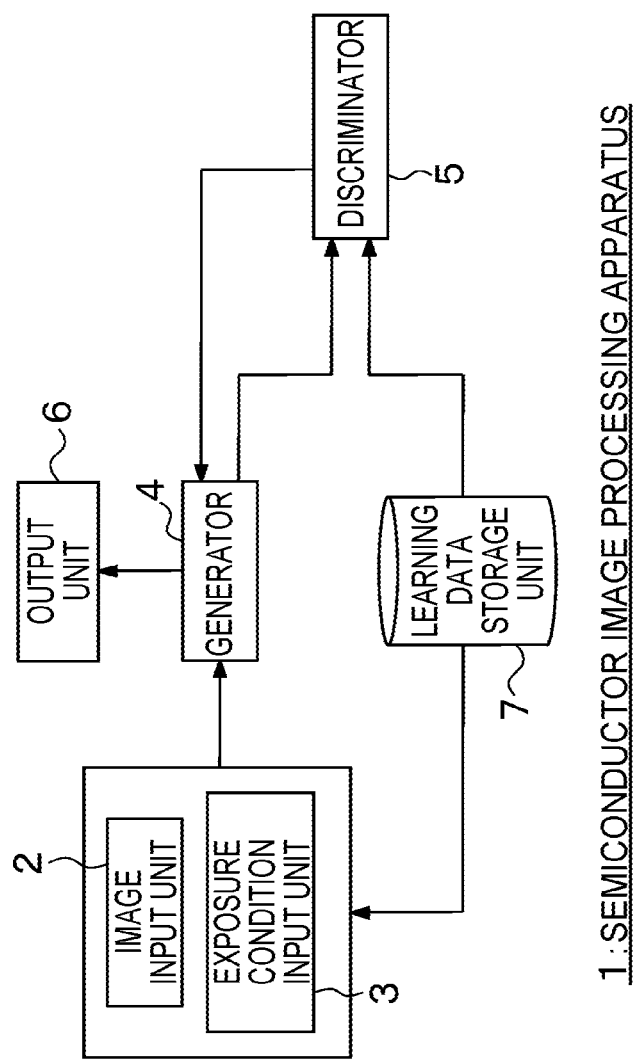
FIG. 1 is a block diagram illustrating a schematic configuration of a semiconductor image processing apparatus according to a first embodiment.

FIG. 1 is a block diagram illustrating a schematic configuration of a semiconductor image processing apparatus 1 according to a first embodiment. The semiconductor image processing apparatus 1 in FIG. 1 includes an image input unit 2, an exposure condition input unit 3, a generator 4, a discriminator 5, and an output unit 6.

The image input unit 2 inputs a first semiconductor image. An example of the first semiconductor image is a CAD drawing that is a source for manufacturing a processed semiconductor device. A processed semiconductor device refers to a semiconductor device actually manufactured. The first semiconductor image may be other than a CAD drawing, and a specific example thereof will be described below. A CAD drawing includes monochrome diagram information, for example. A CAD drawing may be diagram information representing a surface of the processed semiconductor device or diagram information representing a cross section. In a case where the processed semiconductor device includes a plurality of layers, a plurality of CAD drawings for individual layers may be provided.

The exposure condition input unit 3 inputs exposure conditions. Exposure conditions include an exposure amount or focus conditions being setting parameters of an exposure machine (not illustrated) used for manufacturing a processed semiconductor device. An example of the focus condition is a defocus amount.

The exposure conditions are input for the following reason. Main processing procedures of photolithography when manufacturing a semiconductor device include deposition, resist coating, exposure, development, etching, and ashing. With repetition of these processing procedures many times, a semiconductor circuit of the semiconductor device is formed in a plurality of layers. There are many parameters to be set in the semiconductor manufacturing apparatus. Among these, the exposure amount at the time of exposure and the focus conditions out of exposure conditions set in the exposure machine will particularly have a great influence on the performance of the semiconductor circuit. The exposure amount is a parameter representing the time for which the exposure light is continuously applied, and the focus condition is a parameter of a lens position for adjusting a focal position where the exposure light is imaged.

When the exposure amount is large in the case of using a negative resist, the resist would harden and tend to remain at the time of etching, and this would likely to cause the semiconductor circuit underneath the resist to remain at subsequent ashing. When the exposure amount is small, the resist would not harden sufficiently and not tend to remain, and this would likely to cause loss or breakdown of the semiconductor circuit underneath.

Moreover, with correct focusing, the exposure light would be applied to a spot intended by the semiconductor device manufacturers, and this would likely to cause the resist to remain. However, with incorrect focusing, blurring would occur and the exposure light would weaken and spread, and this would likely to cause the loss of the resist, leading to even a loss or breakdown of the semiconductor circuit underneath, or generation of wiring wider than the intended width.

Conversely, in the case of a positive resist, the more exposure light is applied, the more easily the resist would be removed at the time of etching. However, the resist to which the exposure is insufficient would not be removed, causing the semiconductor circuit underneath to remain unseparated.

In view of these circumstances, a second semiconductor image to be described below is generated in consideration of the exposure conditions in the present embodiment.

The generator 4 in FIG. 1 performs a process of extracting a feature amount in consideration of the exposure conditions while gradually reducing the two-dimensional resolution of the first semiconductor image, and thereafter, gradually increases the two-dimensional resolution to generate a second semiconductor image. The second semiconductor image is a semiconductor estimation image generated by the generator 4 in order to estimate a third semiconductor image. The third semiconductor image is, for example, an image captured after a processed semiconductor device is actually manufactured under predetermined exposure conditions. The second semiconductor image and the third semiconductor image may be other than the above-described images, and specific examples thereof will be described below. The generator 4 transmits the first semiconductor image, the second semiconductor image, and the exposure conditions, as a set, to the discriminator 5 and the output unit 6 as will be described below. The output unit 6 outputs the first semiconductor image, the second semiconductor image, and the exposure conditions to a display device (not illustrated), for example. Alternatively, the output unit 6 records the first semiconductor image, the second semiconductor image, and the exposure conditions, as a set, in a recording device (not illustrated).

The discriminator 5 discriminates whether the input images are the first semiconductor image and the second semiconductor image, or the first semiconductor image and the third semiconductor image provided in advance. That is, the discriminator 5 performs true/false judgment whether the second semiconductor image is the third semiconductor image.

The generator 4 performs learning so that the discriminator 5 erroneously discriminates the second semiconductor image as the third semiconductor image based on result of discrimination performed by the discriminator 5. More specifically, the generator 4 calculates the loss of the second semiconductor image based on the true/false discrimination result obtained by the discriminator 5, and performs learning to minimize the loss. The generator 4 generates a second semiconductor image that resembles the third semiconductor image as much as possible so as to deceive the discriminator 5.

More specifically, the generator 4 inputs the first semiconductor image and the exposure conditions to a first neural network corresponding to the GAN, updates a weighting factor of the first neural network, or the like, based on the true/false determination result by the discriminator 5, and then generates a new second semiconductor image by using the updated first neural network.

The discriminator 5 inputs the first semiconductor image, and the second semiconductor image generated by the generator 4, or inputs the first semiconductor image and the third semiconductor image, to the second neural network corresponding to the GAN, and then performs true/false discrimination whether the second semiconductor image is the third semiconductor image. The discriminator 5 performs learning so as not to erroneously discriminate the second semiconductor image as the third semiconductor image, and so as not to discriminate the third semiconductor image as the second semiconductor image, and then, updates weighting factors or the like of the second neural network.

In this manner, the generator 4 and the discriminator 5 perform learning process individually to update the first neural network and the second neural network corresponding to the GAN, so as to finally generate the second semiconductor image similar to the third semiconductor image.

The semiconductor image processing apparatus 1 in FIG. 1 may include a learning data storage unit 7. The learning data storage unit 7 stores various types of information used for the learning process, such as the first semiconductor image, the third semiconductor image, and the exposure conditions described above.

The semiconductor image processing apparatus 1 in FIG. 1 is configured such that the generator 4 and the discriminator 5 compete with each other to bring the second semiconductor image closer to the third semiconductor image. The semiconductor image processing apparatus 1 generates the second semiconductor image and performs true/false discrimination of the second semiconductor image while updating the first neural network and the second neural network corresponding to the GAN described above. This process is referred to as a learning process in the present specification.

Since the input to the generator 4 is a random number in normal GAN, it would be difficult for the generator 4 to generate an image as intended. Therefore, the present embodiment utilizes a technique referred to as pix2pix, a type of Conditional GAN, to give the first semiconductor image such as a CAD drawing to the generator 4 so as to generate the second semiconductor image similar to the third semiconductor image as a goal.

Figure 2:
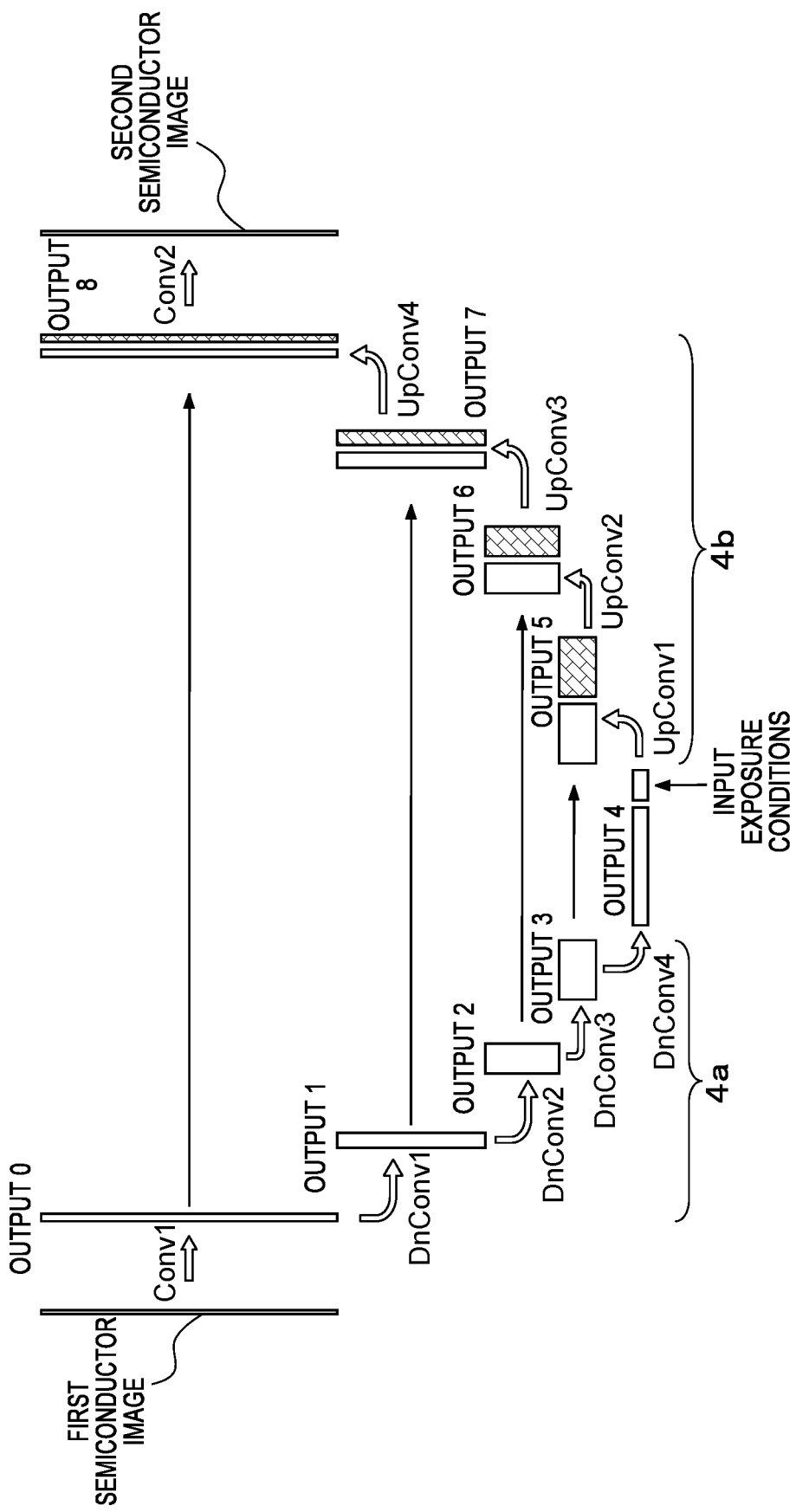
FIG. 2 is a view schematically illustrating processing operation of a generator.

FIG. 2 is a view schematically illustrating processing operation of the generator 4. The first neural network in the generator 4 performs the processing of an encoder 4a and a decoder 4b equivalently. The encoder 4a inputs a first semiconductor image such as a CAD drawing as a condition and outputs an encoded image. FIG. 2 schematically represents the first semiconductor image in a rectangular shape. The vertical direction of the rectangular shape represents the resolution in the two-dimensional direction, and the horizontal direction represents a channel. A channel is information of each color of red, green, and blue, for example, the three primary colors of light. For example, the encoder 4a performs an encoding process in a plurality of stages. In the encoding process, convolution (Conv1) is first performed without reducing the resolution of the input first semiconductor image (output 0). Thereafter, as the encoding stage progresses, the resolution is reduced by ½ and the channel is increased by 2 (DnConv1 to DnConv4). Increasing the number of channels in stages makes it possible to extract feature amounts in stages (outputs 1 to 4).

After the feature amount is extracted by the encoding process, the decoder 4b performs the decoding process in a plurality of stages using the feature amount extracted by the encoding process (outputs 5 to 8). In the decoding process, the resolution is increased by a factor of 2 with the progress of the decoding stage, and the channel is reduced by a factor of ½ (UpConv1 to UpConv4), and then, performing convolution (Conv2) without changing the resolution at a stage where the original resolution can be restored, thereby finally generating the second semiconductor image.

Reducing the resolution stepwise in the encoding process would result in loss of the position information. This makes it difficult to correctly grasp the position information at execution of the decoding process. To handle this, as indicated by the arrow lines in FIG. 2, a new semiconductor image is generated at each of stages of the decoding process with reference to the semiconductor image at each of the stages of the encoding process. This operation makes it possible to generate the second semiconductor image without losing the position information.

During the encoding process in which the encoder 4a extracts the feature amount stepwise or during decoding process performed by the decoder 4b, the generator 4 inputs the exposure condition and extracts a feature amount in consideration of the exposure conditions. That is, the generator 4 inputs the exposure conditions during execution of the feature amount extraction process. The exposure condition is a scalar value that does not include position information. Therefore, inputting exposure conditions together with the first semiconductor image before execution of the encoding process would not significantly affect the feature amount extraction. Moreover, inputting the exposure conditions immediately after the input of the first semiconductor image would cause occurrence of useless calculation during convolution. Inputting the exposure conditions at a stage where the feature amount extraction has progressed to some extent enables adjustment of the extracted feature amount under the exposure conditions, making it possible reduce wasteful calculation of convolution.

Although the example of FIG. 2 is a case where the exposure conditions are input at the stage where the encoding process is completed, exposure conditions may be input at any stage of the encoding process or the decoding process.

Figure 3:
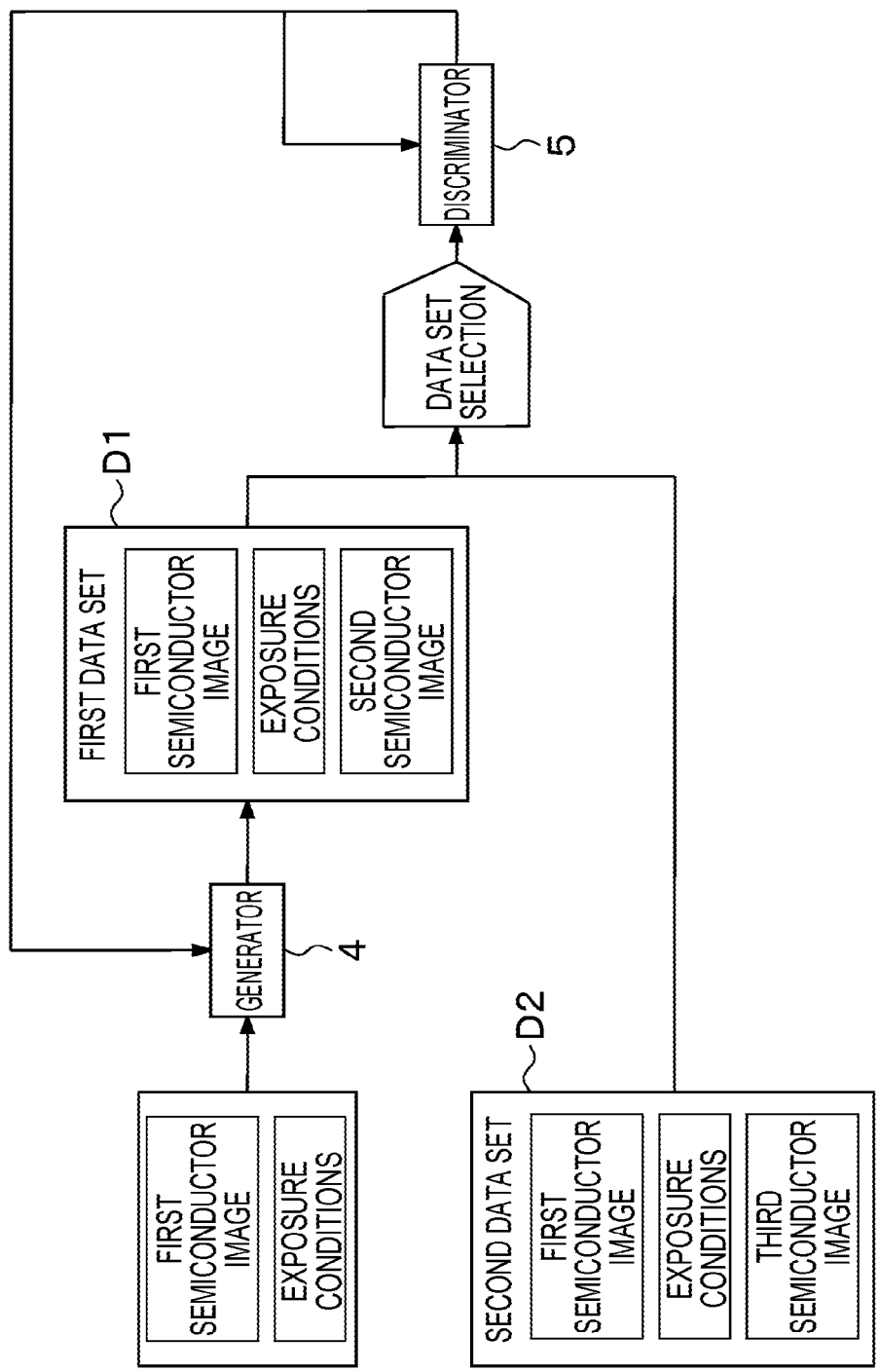
FIG. 3 is a diagram illustrating a flow of processing during learning of the semiconductor image processing apparatus according to the first embodiment.

FIG. 3 is a diagram illustrating a flow of processing during learning of the semiconductor image processing apparatus 1 according to the first embodiment. As illustrated in FIG. 3, the first semiconductor image and the exposure conditions are input to the generator 4. One of a first data set D1 and a second data set D2 is selected and input to the discriminator 5. The first data set D1 includes a first semiconductor image such as a CAD drawing, an exposure condition, and a second semiconductor image generated by the generator 4. The second data set D2 includes a first semiconductor image, an exposure condition, and a third semiconductor image obtained by actually capturing a processed semiconductor device.

The first semiconductor image, the exposure condition, and the second semiconductor image in the first data set D1 are superimposed in a channel direction to be input to the discriminator 5. Similarly, the first semiconductor image, the exposure condition, and the third semiconductor image in the second data set D2 are superimposed in a channel direction to be input to the discriminator 5. Subsequently, the discriminator 5 performs true/false judgment whether the second semiconductor image in the first data set D1 is the third semiconductor image in the second data set D2. The true/false discrimination result obtained by the discriminator 5 will be fed back to the generator 4. The generator 4 learns the true/false discrimination result obtained by the discriminator 5 and generates the second semiconductor image that can be erroneously discriminated as the third semiconductor image by the discriminator 5. That is, the generator 4 learns to generate a second semiconductor image having higher similarity to the third semiconductor image in order to outwit the discriminator 5. The discriminator 5 performs learning so as to find that the second semiconductor image generated by the generator 4 is not the third semiconductor image, and to correctly discriminate the third semiconductor image as the third semiconductor image.

In this manner, repetition of generation of the second semiconductor image and the true/false discrimination performed in the competition of the generator 4 and the discriminator 5 makes it possible to finally generate the second semiconductor image similar to the third semiconductor image.

Figure 4:
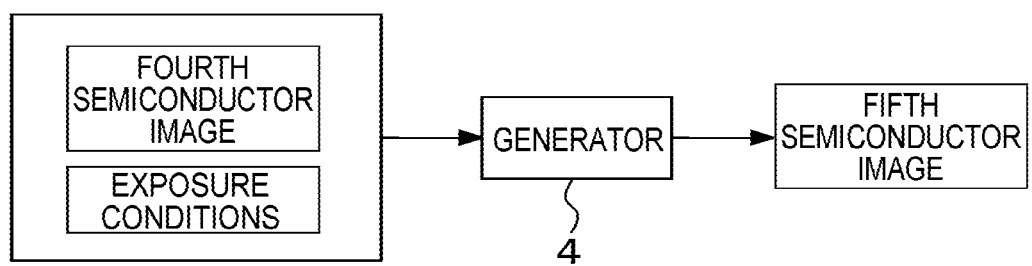
FIG. 4 is a diagram illustrating a flow of processing during inference.

In a case where learning of the generator 4 and the discriminator 5 is completed, the first neural network generated in the learning by the generator 4 can be used for inference (estimation). FIG. 4 is a diagram illustrating a flow of processing during inference. At the time of inference, a fourth semiconductor image such as a CAD drawing to be inferred and exposure conditions are input to the generator 4. The generator 4 inputs the fourth semiconductor image and the exposure conditions to the learned first neural network, performs calculation, and outputs a fifth semiconductor image from the first neural network. The fifth semiconductor image is a semiconductor image estimated from an actual semiconductor image obtained by capturing the processed semiconductor device generated based on the fourth semiconductor image.

With this configuration, it is possible to estimate the fifth semiconductor image under various exposure conditions using the first neural network without actually manufacturing a processed semiconductor device. Therefore, it is possible to predict in advance before actual manufacture how quality the processed semiconductor device would have when the exposure conditions are changed.

Figure 5:
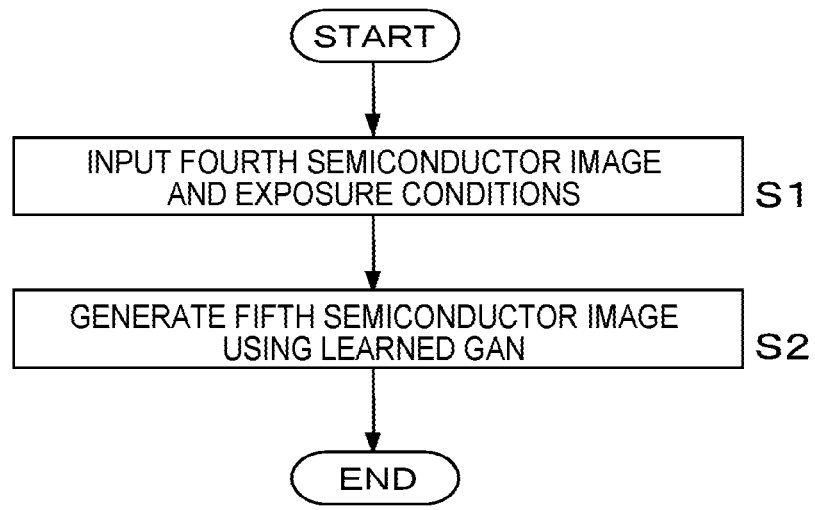
FIG. 5 is a flowchart illustrating processing operation of inference process.

FIG. 5 is a flowchart illustrating processing operation of an inference process. The flowchart in FIG. 5 is executed after the generator 4 and the discriminator 5 finish a learning process. First, a fourth semiconductor image such as a CAD drawing and exposure conditions are input to the generator 4 (step S1). Next, the generator 4 inputs the fourth semiconductor image and the exposure conditions to the learned first neural network of the GAN, and generates the fifth semiconductor image (step S2). More specifically, the generator 4 inputs the fourth semiconductor image and the exposure conditions to the learned first neural network to perform calculation, and then, the data output from the first neural network will be the fifth semiconductor image.

Figure 6:
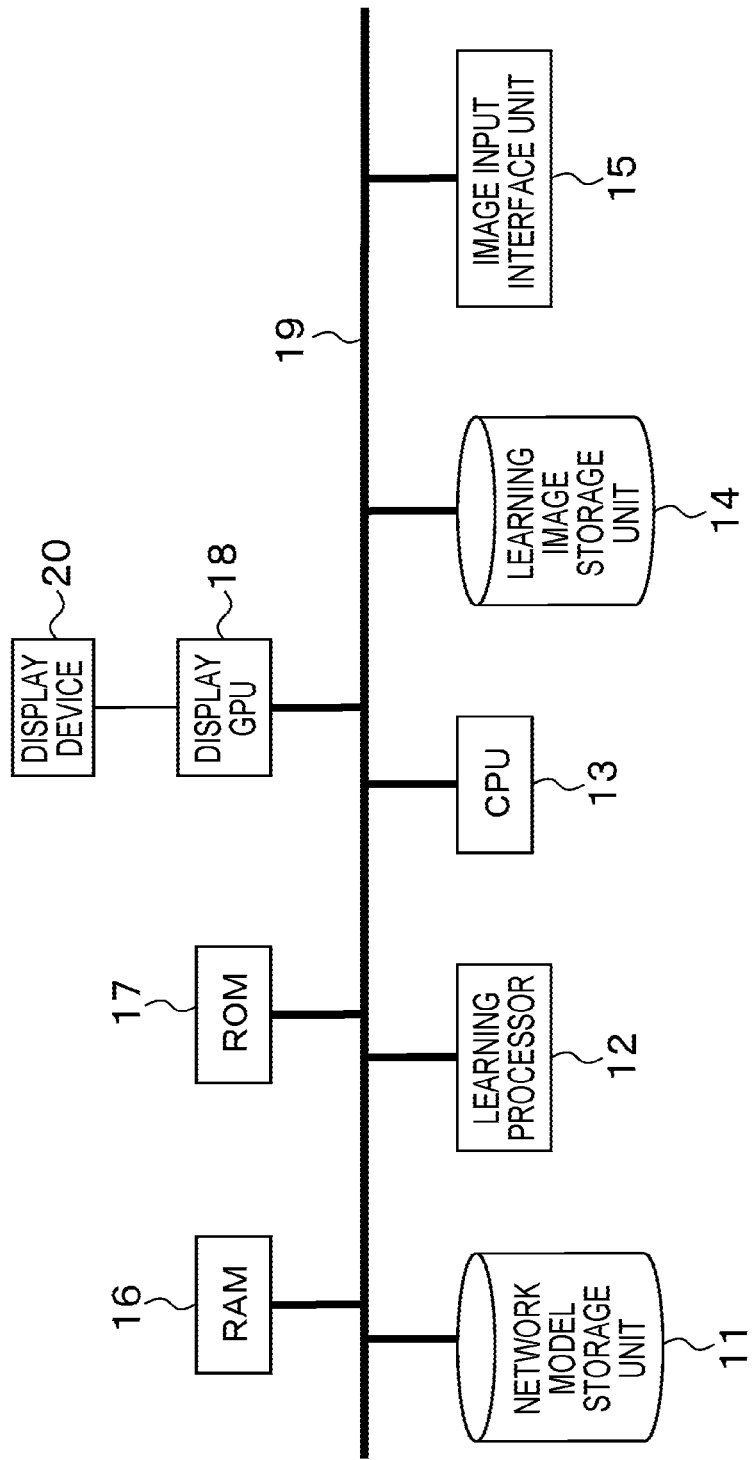
FIG. 6 is a block diagram illustrating a hardware configuration of the semiconductor image processing apparatus of FIG. 1.

FIG. 6 is a block diagram illustrating a hardware configuration of the semiconductor image processing apparatus 1 of FIG. 1. The semiconductor image processing apparatus 1 in FIG. 6 has a configuration in which a network model storage unit 11, a learning processor 12, a CPU 13, a learning image storage unit 14, an image input interface unit 15, a RAM 16, a ROM 17, and a display GPU 18 are connected to a common bus 19. The display GPU 18 is connected to a display device 20.

The network model storage unit 11 stores weight information of the first neural network of the generator 4 corresponding to the GAN and weight information of the second neural network of the discriminator 5, or the like. The learning processor 12 executes a learning process of the generator 4 and the discriminator 5. Specifically, the learning processor 12 performs process of the semiconductor image processing apparatus 1 of FIG. 1. Note that part of the processing of the semiconductor image processing apparatus 1 in FIG. 1 may be performed by a hardware device other than the learning processor 12.

The CPU 13 reads a program from the ROM 17 and executes the program and thereby performs overall control of the semiconductor image processing apparatus 1. At that time, the CPU 13 uses the RAM 16 as work memory. The learning processor 12 executes the learning process of the generator 4 and the discriminator 5 under the instruction of the CPU 13. The learning image storage unit 14 stores a first semiconductor image, a third semiconductor image, and exposure conditions used for the learning process. The image input interface unit 15 performs control of storing, in the learning image storage unit 14, the first semiconductor image, the third semiconductor image, and the exposure conditions input from the image input unit 2 and the exposure condition input unit 3. The display GPU 18 performs control of displaying the first semiconductor image, the second semiconductor image, and the third semiconductor image on the display device 20 as necessary under the instruction of the CPU 13.

In this manner, the semiconductor image processing apparatus 1 according to the first embodiment inputs the exposure conditions during the process of extracting the feature amount of the first semiconductor image by the generator 4. Therefore it is possible to extract the feature amount of the first semiconductor image in consideration of the exposure conditions, making it possible to improve the quality of the second semiconductor image generated by the generator 4. That is, the second semiconductor image generated by the generator 4 takes into account the exposure conditions set in the exposure machine. Accordingly, there is no possibility of occurrence of variation, due to the exposure conditions, in the degree of similarity between the second semiconductor image and the third semiconductor image, making it possible to generate a second semiconductor image similar to the third semiconductor image obtained by actually imaging the processed semiconductor device.

Second Embodiment

In conventional GAN discriminators, it is common to perform true/false judgment with a plurality of stages of convolutions for the entire input image. In this method, however, true/false discrimination is performed mainly based on overall consistency without being able to grasp specific features. Therefore, generation results would tend to be blurred with little focus on reproducibility of details.

To avoid this, the pix2pix discriminator uses PatchGAN to enable high-definition image output. PatchGAN divides an image into a plurality of partial images (also referred to as patches), performs a plurality of stages of convolution on each of the patches to perform true/false discrimination, and then averages the results of individual patches to perform final true/false discrimination. This enables true/false discrimination based on specific features. The pix2pix generator performs learning to outwit the discriminator, making it possible to generate high-definition images even in the details.

Figure 7:
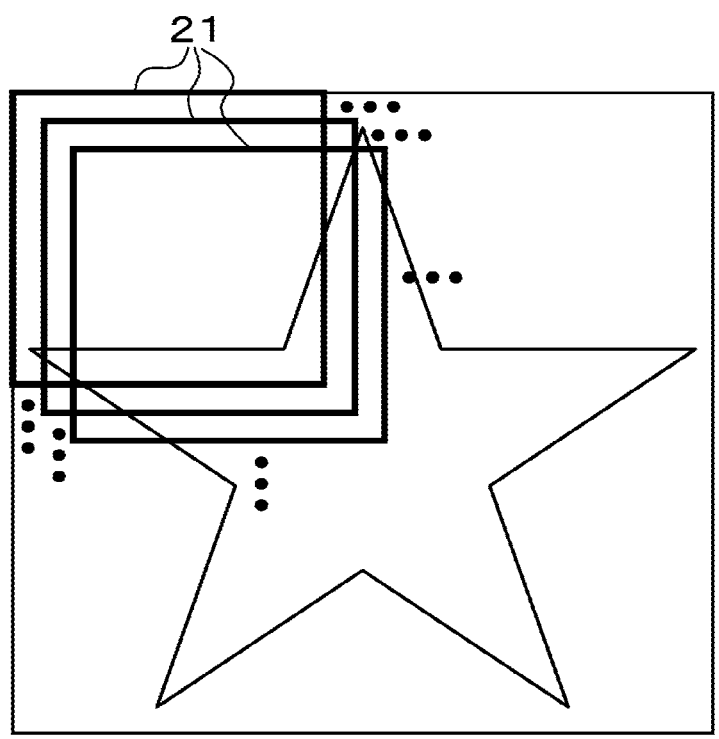
FIG. 7 is a view illustrating an example of a patch.

FIG. 7 is a view illustrating an example of a patch 21. The patch 21 in FIG. 7 has a rectangular shape and is discretely set in a two-dimensional direction. Adjacent patches partially overlap with each other. A discriminator of the pix2pix performs true/false discrimination for each of the patches 21 and averages the true/false determination results of all the patches 21 to perform final true/false discrimination. For example, in a case where the size of the patch 21 is 78×78 pixels and a plurality of patches 21 is set in units of 16 pixels in the two-dimensional direction, there would be 4×4=16 patches 21 assuming that the image size is 126×126 pixels.

The patch positions are set discretely in the PatchGAN described above, causing occurrence of processing irregularities. This leads to occurrence of locations where the discriminator performs strict true/false and discrimination and locations where the true/false discrimination is loosely performed. The generator learns to generate a semiconductor image similar to the captured image of the processed semiconductor device at a location where the true/false discrimination is strictly performed, while learning of the generator would be coarse at a location where the true/false discrimination is loosely performed. This leads to occurrence of unevenness in the semiconductor image generated by the generator depending on the patch position. In a case where positions of individual patches in the image are fixed, lattice-like noise would emerge in the generated semiconductor image due to the above-described unevenness. For example, in a case where the patch 21 moves in a two-dimensional direction in units of 16 pixels, there would be an occurrence of a difference in the learning results of individual patches 21 in a 16 pixel cycle, leading to occurrence of unevenness in a 16 pixel cycle. This would overlap with each other, resulting in noise having a size of about 64×64 pixels. This type of noise is unnoticeable in a case where the input image is a natural image. However, in a case where the input image is an image having a wide region of a same color, such as a CAD drawing, the noise would be noticeable in this region. In addition, unevenness in processing of the discriminator can occur even in a general discriminator other than PatchGAN in which unevenness is specifically remarkable. The second embodiment is presented to reduce the above-described noise due to the unevenness.

Figure 8:
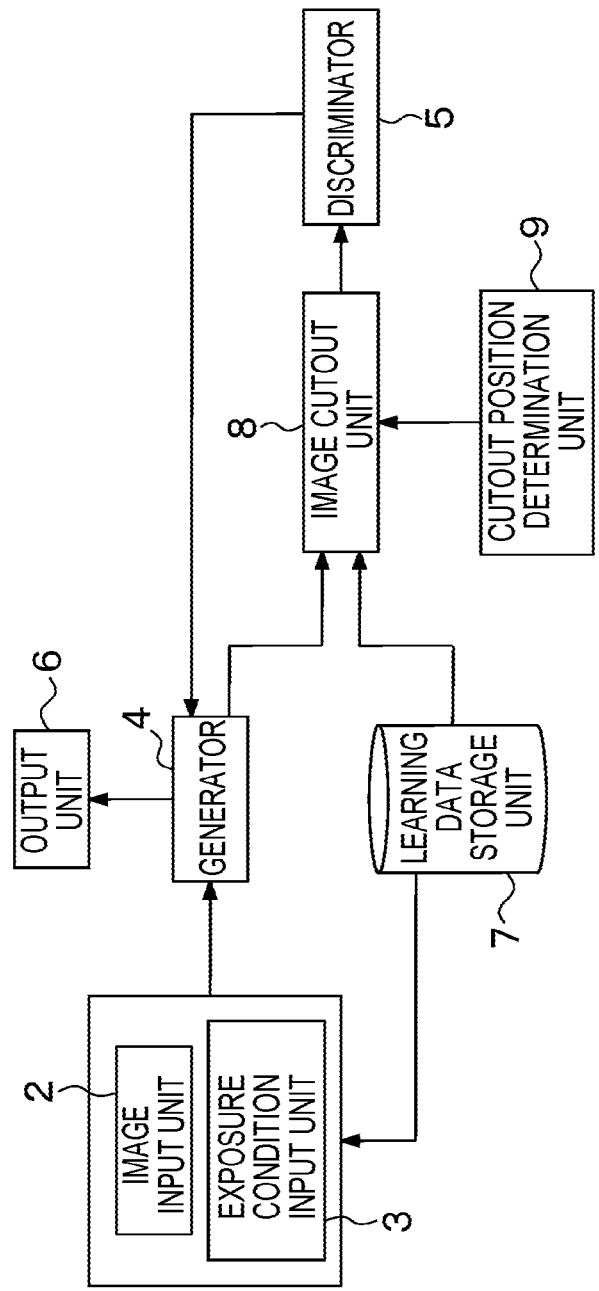
FIG. 8 is a block diagram illustrating a schematic configuration of a semiconductor image processing apparatus according to a second embodiment.

FIG. 8 is a block diagram illustrating a schematic configuration of a semiconductor image processing apparatus 1a according to the second embodiment. The semiconductor image processing apparatus 1a in FIG. 8 includes an image cutout unit 8 and a cutout position determination unit 9 in addition to the configuration of the semiconductor image processing apparatus 1 in FIG. 1.

The image cutout unit 8 cuts out a partial image from each of the first semiconductor image and the second semiconductor image, or the first semiconductor image and the third semiconductor image. The image cutout unit 8 inputs a first semiconductor partial image and a second semiconductor partial image respectively cut out from the first and the second semiconductor images, or inputs the first semiconductor partial image, and a third semiconductor partial image cut out from the third semiconductor image, to the discriminator 5 together with exposure conditions.

The cutout position determination unit 9 determines cutout positions so that the cutout positions of the first semiconductor image, the second semiconductor image, and the third semiconductor image are not fixed. The cutout position determination unit 9 may randomly set the cutout position, or may shift the cutout positions by n pixels (n is an integer of 1 or more) every time the generator 4 and the discriminator 5 perform learning.

Figure 9A:
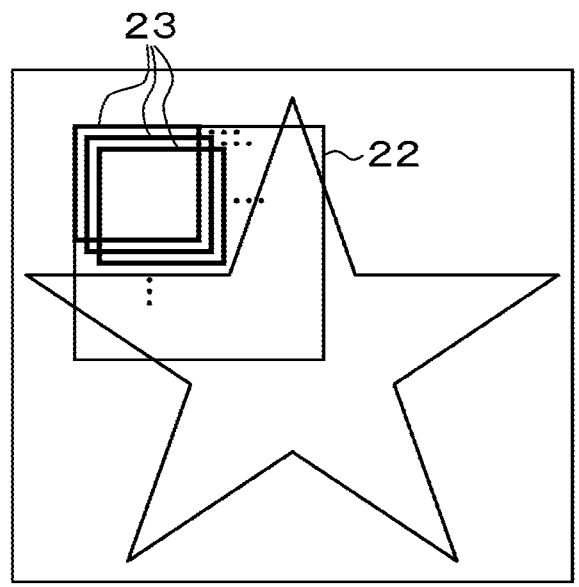
FIGS. 9A and 9B are views illustrating an example of cutting out a partial image from each of a second semiconductor image and a third semiconductor image.
Figure 9B:
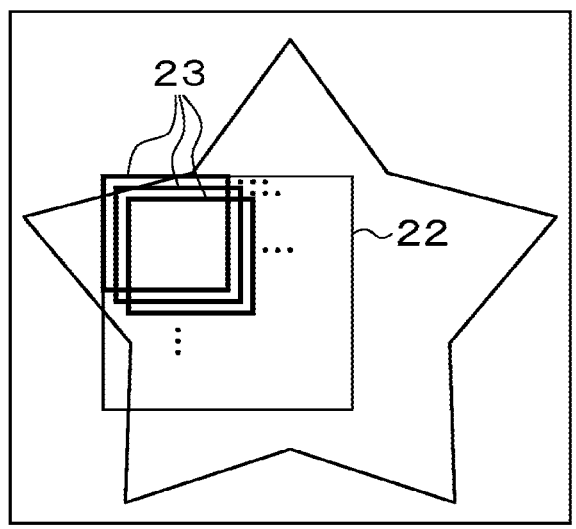

FIGS. 9A and 9B are views illustrating an example of cutting out a partial image from each of the first semiconductor image, the second semiconductor image, and the third semiconductor image. The solid line frame in FIG. 9A illustrates a partial image 22 cut out by the image cutout unit 8 during Nth learning. As illustrated in FIG. 9B, during the (N+1) th learning, the partial image 22 is cut out at a cutout position different from the position at the Nth time. The discriminator 5 divides the cut out partial image 22 into a plurality of smaller sub-partial images 23, that is, patches, as illustrated in the sub-frames of FIGS. 9A and 9B, and then true/false discrimination is performed for each of the sub-partial images 23. Subsequently, the discriminator 5 performs averaging of the true/false discrimination results of the plurality of sub-partial images 23, or the like, to perform true/false judgment as to whether the second semiconductor partial image is the third semiconductor partial image. The second semiconductor partial image and the third semiconductor partial image have different cutout positions every time the learning is performed. Therefore, unlike the case where the cutout position is fixed, unevenness in processing of the discriminator 5 is not fixed at one position assuming the position on the image before cutout. Accordingly, it is possible to perform learning evenly, enabling suppression of the lattice noise appearing in the second semiconductor image.

In the present embodiment, the cutout position of the partial image 22 differs every time learning is performed. Therefore, a boundary position of the sub-partial image 23 included in each of the partial images 22 differs for each of times of learning, leading to suppression of occurrence of periodic noise in the second semiconductor partial image generated by performing true/false discrimination for each of sub-partial images 23.

As illustrated in FIGS. 9A and 9B, the second semiconductor image and the third semiconductor image used for each of times of learning need not necessarily be semiconductor images corresponding to the same CAD drawing. For example, the learning process of the generator 4 and the discriminator 5 may be performed using a second semiconductor image or a third semiconductor image corresponding to a plurality of CAD drawings.

Figure 10:
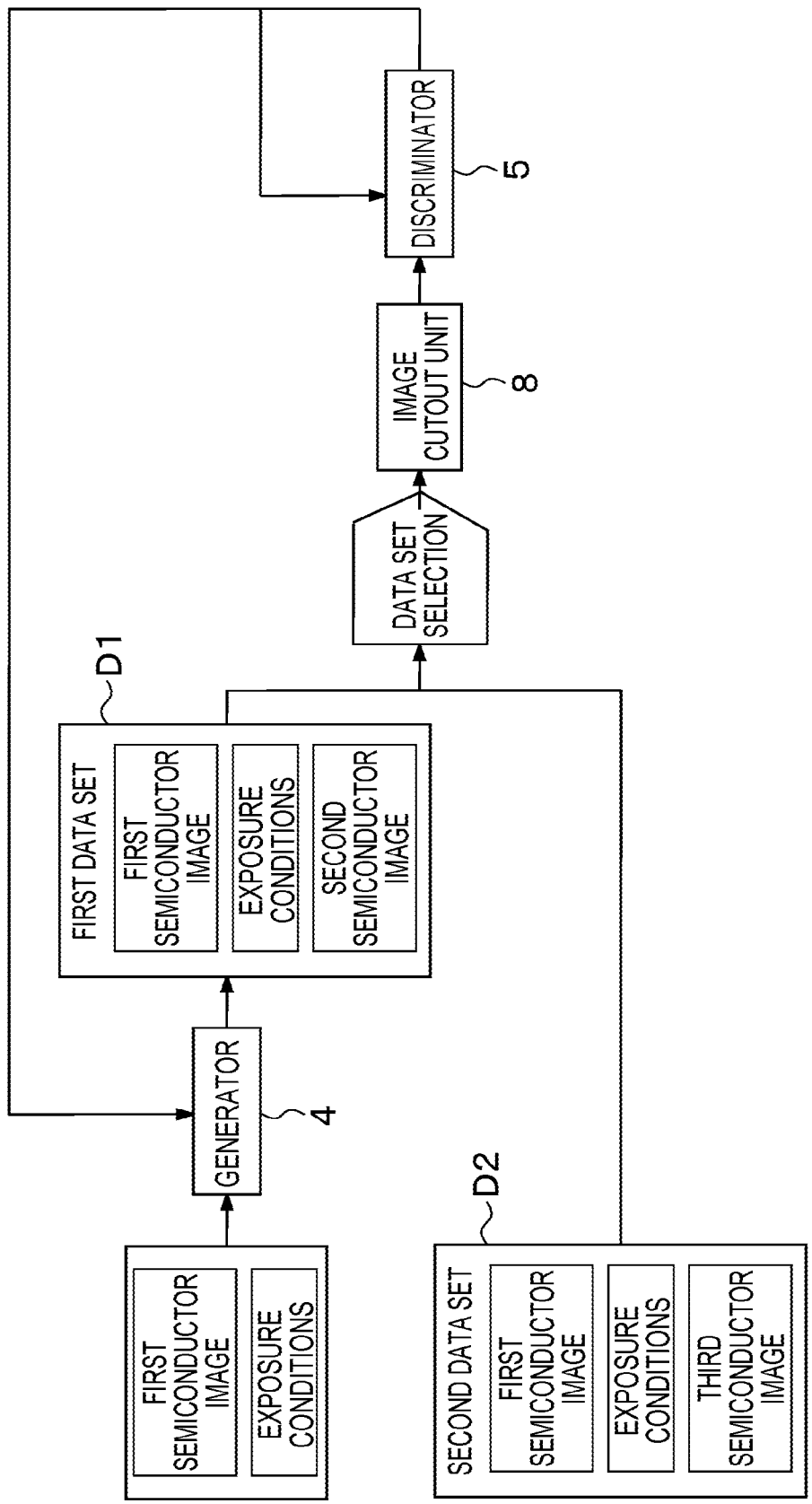
FIG. 10 is a diagram illustrating a flow of processing during learning of the semiconductor image processing apparatus according to the second embodiment.

FIG. 10 is a diagram illustrating a flow of processing during learning of the semiconductor image processing apparatus 1a according to the second embodiment. The generator 4 outputs a first data set D1 including a first semiconductor image, a second semiconductor image, and exposure conditions. A second data set D2 including a first semiconductor image, a third semiconductor image, and exposure conditions is provided in advance. The image cutout unit 8 selects one of the first data set D1 and the second data set D2 and performs image cutout on the selected data set. For example, the image cutout unit 8 alternately selects the first data set D1 and the second data set D2, and cuts out the partial image 22 at the cutout position determined by the cutout position determination unit 9.

The discriminator 5 inputs the first semiconductor image cut out from the first data set D1, the second semiconductor image, and the exposure conditions in an overlapped manner in the channel direction. Similarly, the discriminator 5 inputs the first semiconductor image and the third semiconductor image cut out from the second data set D2 and the exposure conditions in an overlapping manner in the channel direction. The discriminator 5 discriminates whether the second semiconductor partial image cut out in the first data set D1 is the third semiconductor partial image cut out in the second data set D2. The discrimination result obtained by the discriminator 5 is fed back to the discriminator 5 itself and the generator 4. The discriminator 5 performs learning so as to be able to correctly discriminate between the first data set D1 and the second data set D2. The generator 4 performs learning in consideration of the true/false discrimination result obtained by the discriminator 5.

Figure 11:
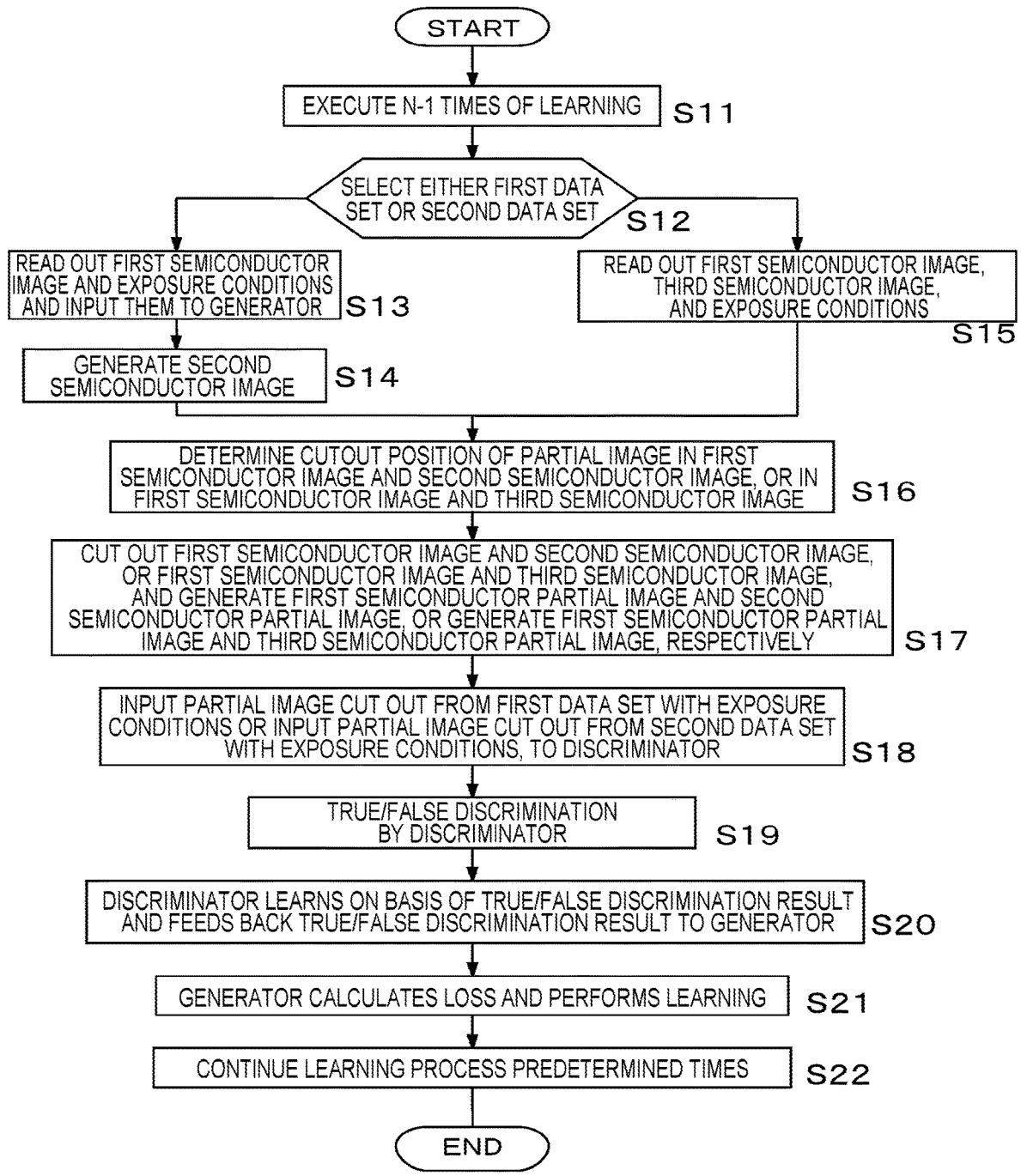
FIG. 11 is a flowchart illustrating processing operation during learning of the semiconductor image processing apparatus according to the second embodiment.

FIG. 11 is a flowchart illustrating processing operation during learning of the semiconductor image processing apparatus 1a according to the second embodiment. This flowchart illustrates processing operation in the case of performing learning for the Nth time (N is an integer of 2 or more) after (N−1) times of learning (step S11).

When performing the N-th learning, either the first data set D1 or the second data set D2 is selected (step S12). In a case where the first data set D1 is selected, the first semiconductor image and the exposure condition are read out from the learning data storage unit 7 and input to the generator 4 (step S13). Next, the generator 4 generates a second semiconductor image based on the determination result of the (N−1) th discriminator 5, the first semiconductor image and the exposure conditions (step S14).

In contrast, in a case where the second data set D2 is selected in step S12, the first semiconductor image, the third semiconductor image, and the exposure conditions are read out from the learning data storage unit 7 (step S15).

Next, the cutout position determination unit 9 determines the cutout position of the partial image 22 in the first semiconductor image and the second semiconductor image, or in the first semiconductor image and the third semiconductor image (step S16). Next, the image cutout unit 8 cuts out the first semiconductor image and the second semiconductor image, or the first semiconductor image and the third semiconductor image, at the determined cutout position, and generates the first semiconductor partial image and the second semiconductor partial image, or generates the first semiconductor partial image and the third semiconductor partial image, respectively (step S17).

Next, the discriminator 5 inputs the first semiconductor partial image and the second semiconductor partial image cut out from the first data set D1 and the exposure conditions in an overlapped manner in the channel direction. Alternatively, the discriminator 5 inputs the first semiconductor partial image and the third semiconductor partial image cut out from the second data set D2 and the exposure conditions in an overlapping manner in the channel direction (step S18). Subsequently, the discriminator 5 performs true/false discrimination whether the second semiconductor partial image is the third semiconductor partial image (step S19). The discriminator 5 learns based on the true/false discrimination result and feeds back the true/false discrimination result to the generator 4 (step S20). The generator 4 calculates a loss based on the true/false discrimination result obtained by the discriminator 5, and performs a learning process based on the calculated loss (step S21).

Thereafter, learning by the generator 4 and the discriminator 5 is repeated until a predetermined condition is reached (step S22). Here, the predetermined condition includes a case where the number of repetitions of learning reaches a prescribed number, the accuracy of the second semiconductor image reaches a sufficient level, or there is no prospect that the accuracy of the second semiconductor image will reach a sufficient level.

The inference process of the semiconductor image processing apparatus 1a according to the second embodiment is similar to the processing in FIGS. 4 and 5. The hardware configuration of the semiconductor image processing apparatus 1a is similar to the configuration in FIG. 6. The processing operations of the image cutout unit 8 and the cutout position determination unit 9 in FIG. 8 can be executed by, for example, the learning processor 12 in FIG. 6.

In this manner, the second embodiment performs true/false discrimination whether the second semiconductor partial image and the third semiconductor partial image cut out with various cutout positions match for each of the second semiconductor image generated by the generator 4 and the third semiconductor image provided in advance, and feeds back the discrimination result to the generator 4 so as to repeat learning of re-generating the second semiconductor image. With this configuration, it is possible to suppress unevenness in the second semiconductor image.

The above has described an example of the semiconductor image processing apparatus 1a according to the second embodiment in which the feature amount is extracted in consideration of the exposure conditions is similarly to the first embodiment. However, the semiconductor image processing apparatus 1a of the second embodiment does not always have to extract the feature amount in consideration of the exposure condition.

Third Embodiment

The first and second embodiments described above are an example in which the first semiconductor image is a CAD drawing, for example, the third semiconductor image is an image actually captured from a processed semiconductor device, for example, and the second semiconductor image is an estimated third semiconductor image, for example, although other cases are conceivable.

First of all, a captured image of a processed semiconductor device includes three types of images: an electron microscope image, an optical microscope image, and a diffraction image. Examples of the electron microscope image include a Scanning Electron Microscopy (SEM) image, a Transmission Electron Microscopy (TEM) image, or a Scanning Transmission Electron Microscope (STEM) image. The optical microscope image is an image obtained by capturing an optical image magnified by an optical lens, with an imaging sensor or a camera. The frequency band of light to be used includes visible light, ultraviolet light, extreme ultraviolet (EUV), X-rays, infrared light, and thus, it is necessary to use an imaging sensor corresponding to the light frequency band.

From the above, there are four candidates for the first semiconductor image and the third semiconductor image: a CAD drawing, an electron microscope image, an optical microscope image, and a diffracted light image. The second semiconductor image is an estimated third semiconductor image obtained by the generator 4 that has performed learning.

FIG. 12 is a diagram illustrating all combinations of the first and third semiconductor images. 1) of FIG. 12 is a case where the first semiconductor image is a CAD drawing and the third semiconductor image is an electron microscope image. 2) is the reverse of 1). 3) is a case where the first semiconductor image is a CAD drawing and the third semiconductor image is an optical microscope image. 4) is the reverse of 3). 5) is a case where the first semiconductor image is a CAD drawing and the third semiconductor image is a diffraction image. 6) is the reverse of 5). 7) is a case where the first semiconductor image is an optical microscope image and the third semiconductor image is an electron microscope image. 8) is the reverse of 7). 9) is a case where the first semiconductor image is a diffraction image and the third semiconductor image is an electron microscope image. 10) is the reverse of 9). 11) is a case where the first semiconductor image is a diffraction image and the third semiconductor image is an optical microscope image. 12) is the reverse of 11).

In this manner, there can be a total of 12 types of combinations of the first semiconductor image and the third semiconductor image. In the present embodiment, it is possible to generate a semiconductor image by using one of the two selected images out of a CAD drawing, an electron microscope image, an optical microscope image, and a diffracted light image, and by estimating the other in consideration of exposure conditions. With this configuration, it is possible to generate a semiconductor image similar to the captured image of a manufactured semiconductor device prior to the actual manufacturing of the semiconductor device.

Furthermore, according to the semiconductor image processing apparatuses 1 and 1a of the first to third embodiments, learning process is performed using a third semiconductor image in a case where the third semiconductor image is provided for a part of a CAD drawing, making it possible to generate a second semiconductor image that has estimated a third semiconductor image for the other part of the CAD drawing. In this manner, the semiconductor image processing apparatuses 1 and 1a can generate the second semiconductor image by performing processing of interpolation or extrapolation. Furthermore, in a case where a third semiconductor image is provided for several exposure conditions, the semiconductor image processing apparatuses 1 and 1a perform learning processing using the third semiconductor image, making it possible to generate the second semiconductor image that has estimated the third semiconductor image regarding the other exposure conditions.

At least a part of the semiconductor image processing apparatuses 1 and 1a described in the above-described embodiments may be configured by hardware or software. In a case of using a configuration by software, a program to implement at least a part of the function of the semiconductor image processing apparatus 1 and 1a may be stored in a recording medium such as a flexible disk and a CD-ROM 17 to be loaded on a computer to be executed. The recording medium is not limited to a detachable one such as a magnetic disk and an optical disk, and may be a fixed type recording medium such as a hard disk device and a memory device.

Moreover, a program to implement at least a part of the function of the semiconductor image processing apparatus 1 and 1a may be distributed via a communication channel (including radio communication) such as the Internet. Furthermore, the program may be encrypted, modulated, or compressed, and then distributed via a wired or radio channels including the Internet, or may be stored in a recording medium to be distributed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor image processing apparatus comprising:
    an image input circuitry configured to input a first semiconductor image;
    an exposure condition input circuitry configured to input exposure conditions;
    a generator configured to perform a process of extracting a feature amount in consideration of the exposure conditions while reducing resolution of the first semiconductor image and thereafter use the extracted feature amount to increase the resolution to generate a second semiconductor image; and
    a discriminator configured to discriminate whether the input image is the second semiconductor image or a third semiconductor image provided in advance,
    wherein the generator is configured to perform learning so that the discriminator erroneously discriminates the second semiconductor image as the third semiconductor image based on a result discriminated by the discriminator, and
    the discriminator is configured to perform learning so as not to erroneously discriminate the second semiconductor image as the third semiconductor image, and not to erroneously discriminate the third semiconductor image as the second semiconductor image.

2. The semiconductor image processing apparatus according to claim 1,
    wherein the exposure conditions include an exposure amount of an exposure machine used at the time of manufacturing a processed semiconductor device corresponding to the first to third semiconductor images.

3. The semiconductor image processing apparatus according to claim 1,
    wherein the exposure conditions include focus conditions of an exposure machine used at the time of manufacturing a processed semiconductor device corresponding to the first to third semiconductor images.

4. The semiconductor image processing apparatus according to claim 1,
    wherein the first semiconductor image is a semiconductor design image for designing a processed semiconductor device,
    the third semiconductor image is a semiconductor captured image obtained by capturing the processed semiconductor device, and
    the second semiconductor image is a semiconductor estimation image for estimating the third semiconductor image.

5. The semiconductor image processing apparatus according to claim 4,
    wherein the semiconductor captured image is a captured image of an image magnified by an electron microscope, a captured image of an image magnified by an optical microscope, or a captured image of a diffraction image.

6. The semiconductor image processing apparatus according to claim 1,
    wherein the first semiconductor image is a semiconductor captured image obtained by capturing a processed semiconductor device,
    the third semiconductor image is a semiconductor design image for designing the processed semiconductor device, and
    the second semiconductor image is a semiconductor estimation image for estimating the third semiconductor image.

7. The semiconductor image processing apparatus according to claim 6,
    wherein the semiconductor captured image is a captured image of an image magnified by an electron microscope, a captured image of an image magnified by an optical microscope, or a captured image of a diffraction image.

8. The semiconductor image processing apparatus according to claim 1,
    wherein the first semiconductor image is a semiconductor captured image obtained by capturing a processed semiconductor device,
    the third semiconductor image is a semiconductor captured image obtained by capturing the processed semiconductor device in a method different from the case of the first semiconductor image, and
    the second semiconductor image is a semiconductor estimation image for estimating the third semiconductor image.

9. The semiconductor image processing apparatus according to claim 8,
    wherein the semiconductor captured image is a captured image of an image magnified by an electron microscope, a captured image of an image magnified by an optical microscope, or a captured image of a diffraction image.

* * * * *